United States Patent
Lee et al.

(10) Patent No.: US 9,300,111 B2
(45) Date of Patent: Mar. 29, 2016

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Jong Ho Lee, Suwon-si (KR); Chan Mook Lim, Seongnam-si (KR); Young Chul Shin, Yongin-si (KR); Su Hyun Jo, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 4 days.

(21) Appl. No.: 14/154,556

(22) Filed: Jan. 14, 2014

(65) Prior Publication Data

US 2014/0219304 A1 Aug. 7, 2014

(30) Foreign Application Priority Data

Feb. 1, 2013 (KR) .......................... 10-2013-0011833

(51) Int. Cl.
| | |
|---|---|
| *H01L 33/00* | (2010.01) |
| *H01S 5/02* | (2006.01) |
| *H01L 33/38* | (2010.01) |
| *H01L 33/44* | (2010.01) |

(52) U.S. Cl.
CPC ................ *H01S 5/02* (2013.01); *H01L 33/382* (2013.01); *H01L 33/44* (2013.01); *H01L 33/0079* (2013.01)

(58) Field of Classification Search
CPC .... H01L 33/0079; H01L 33/382; H01L 33/44
USPC .................................................. 257/79–103
See application file for complete search history.

(56) References Cited

U.S. PATENT DOCUMENTS

| | | | |
|---|---|---|---|
| 7,964,881 B2 | 6/2011 | Choi et al. | |
| 2003/0141496 A1 | 7/2003 | Illek et al. | |
| 2010/0289041 A1 | 11/2010 | Shakuda | |
| 2011/0156064 A1* | 6/2011 | Seo | H01L 25/0753 257/88 |
| 2012/0032218 A1* | 2/2012 | Choi et al. | 257/98 |
| 2012/0138969 A1* | 6/2012 | Moon et al. | 257/88 |

FOREIGN PATENT DOCUMENTS

| | | |
|---|---|---|
| JP | 2007-258600 A | 10/2007 |
| JP | 2009-135148 A | 6/2009 |
| JP | 2010-118624 A | 5/2010 |
| KR | 10-2006-0087171 A | 8/2006 |
| KR | 10-2008-0002161 A | 1/2008 |
| KR | 10-2011-0059669 A | 6/2011 |
| KR | 10-2011-0129620 A | 12/2011 |
| KR | 10-2012-0048331 A | 5/2012 |
| WO | WO 2010047553 A2 * | 4/2010 |

* cited by examiner

*Primary Examiner* — Mohsen Ahmadi
*Assistant Examiner* — Frederick B Hargrove
(74) *Attorney, Agent, or Firm* — Lee & Morse, P.C.

(57) ABSTRACT

A semiconductor light emitting device includes a conductive substrate, a light emitting laminate including a second conductivity type semiconductor layer, an active layer, and a first conductivity type semiconductor layer stacked on the conductive substrate, a first electrode layer electrically connected to the first conductivity type semiconductor layer, a second electrode layer between the conductive substrate and the second conductivity type semiconductor layer, the second electrode layer being electrically connected to the second conductivity type semiconductor layer, and a passivation layer between the active layer and the second electrode layer, the passivation layer covering at least a lateral surface of the active layer of the light emitting laminate.

10 Claims, 15 Drawing Sheets

SEMICONDUCTOR LIGHT EMITTING DEVICE

CROSS-REFERENCE TO RELATED APPLICATION

Korean Patent Application No. 10-2013-0011833, filed on Feb. 1, 2013, in the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

In general, nitride semiconductor light emitting devices have been widely used in green or blue light emitting diodes (LEDs) or laser diodes (LDs) provided as light sources in, e.g., full color displays, image scanners, various signal systems, and optical communications devices. Such nitride semiconductor light emitting devices may be provided as light emitting devices having active layers that emit light of various colors including blue and green, using the recombination of electrons and holes.

Since the development of nitride semiconductor light emitting devices, significant technical advances have been achieved with regard thereto, and the range of applications therefor has been extended, such that significant research into nitride semiconductor light emitting devices as light sources for general lighting devices and electrical apparatuses has been undertaken. Particularly, while nitride semiconductor light emitting devices are mainly used as components applied to low current and low power mobile products according to the related art, the range of applications thereof has recently been expanded into the field of high current and high power products. Thus, studies aimed at improving luminous efficiency and quality of semiconductor light emitting devices have been actively ongoing. In particular, semiconductor light emitting devices having various types of electrode structure have been developed in order to improve the optical power and reliability thereof.

SUMMARY

An aspect of embodiments provides a semiconductor light emitting device allowing for the simplification of a manufacturing process thereof and having improved current spreading efficiency.

According to an aspect of embodiments, there is provided a semiconductor light emitting device including a conductive substrate, a light emitting laminate including a second conductivity type semiconductor layer, an active layer, and a first conductivity type semiconductor layer stacked on the conductive substrate, a first electrode layer electrically connected to the first conductivity type semiconductor layer, a second electrode layer between the conductive substrate and the second conductivity type semiconductor layer, the second electrode layer being electrically connected to the second conductivity type semiconductor layer, and a passivation layer between the active layer and the second electrode layer, the passivation layer covering at least a lateral surface of the active layer of the light emitting laminate.

The semiconductor light emitting device may further include a conductive via extended from the first electrode layer and penetrating through the second conductivity type semiconductor layer and the active layer to be connected to an interior of the first conductivity type semiconductor layer; a first insulating layer electrically insulating the conductive via from the second conductivity type semiconductor layer and the active layer; a second insulating layer electrically insulating the first electrode layer and the second electrode layer from each other; and an electrode pad formed on a region of the second electrode layer, extended to the exterior of the light emitting laminate, wherein the first electrode layer may be formed between the conductive substrate and the second electrode layer The second electrode layer may have a region thereof protruded in a direction towards the light emitting laminate.

The second electrode layer may have a region thereof bent in a direction from the conductive substrate towards the light emitting laminate.

The passivation layer may be an etch stop layer having etching characteristics different from those of a semiconductor material forming the light emitting laminate.

The semiconductor light emitting device may further include a second conductivity type ohmic electrode layer formed between the second conductivity type semiconductor layer and the second electrode layer.

The semiconductor light emitting device may further include a first conductivity type ohmic electrode layer formed between the first conductivity type semiconductor layer and the first electrode layer.

The passivation layer may be formed of the same material as the first insulating layer.

The electrode pad may be formed on a partial region of the second electrode layer extended in a direction away from the conductive via based on the protruded region of the second electrode layer.

The electrode pad may be formed on a partial region of the second electrode layer extended in a direction away from the conductive via based on the bend region of the second electrode layer.

The first and second conductivity type semiconductor layers may be p-type and n-type semiconductor layers, respectively.

According to another aspect of embodiments, there is provided a semiconductor light emitting device including a conductive substrate, a light emitting laminate including a second conductivity type semiconductor layer, an active layer, a first conductivity type semiconductor layer sequentially formed on the conductive substrate, a second electrode layer formed between the conductive substrate and the second conductivity type semiconductor layer so as to be electrically connected to the second conductivity type semiconductor layer, a first electrode layer formed between the conductive substrate and the second electrode layer, a conductive via extended from the first electrode layer and passing through the second conductivity type semiconductor layer and the active layer to be connected to an interior of the first conductivity type semiconductor layer, an insulating layer electrically insulating the conductive via from the second conductivity type semiconductor layer and the active layer and electrically insulating the first electrode layer and the second electrode layer from each other, an electrode pad formed on a region of the second electrode layer, extended to the exterior of the light emitting laminate, and an etch stop layer formed between the active layer and the second electrode layer so as to cover at least a lateral surface of the active layer of the light emitting laminate and having etching characteristics different from those of a semiconductor material forming the light emitting laminate.

The second electrode layer may have a region thereof protruded in a direction towards the light emitting laminate, and at least the lateral surface of the active layer of the light emitting laminate may be surrounded by the etch stop layer formed on an upper surface of the protruded region of the second electrode layer.

The second electrode layer may have a region thereof bent in a direction away from the conductive substrate towards the light emitting laminate, and at least the lateral surface of the active layer of the light emitting laminate may be surrounded by the etch stop layer formed on an upper surface of the bend region of the second electrode layer.

The electrode pad may be formed on a partial region of the second electrode layer extended in a direction away from the conductive via based on the protruded region of the second electrode layer.

According to another aspect of embodiments, there is provided a semiconductor light emitting device including a conductive substrate, a light emitting laminate including a second conductivity type semiconductor layer, an active layer, and a first conductivity type semiconductor layer stacked on the conductive substrate, a first electrode layer electrically connected to the first conductivity type semiconductor layer, a second electrode layer between the conductive substrate and the second conductivity type semiconductor layer, the second electrode layer being electrically connected to the second conductivity type semiconductor layer, and a passivation layer directly between the light emitting laminate and the second electrode layer, the passivation layer covering at least a lateral surface of the active layer of the light emitting laminate.

The passivation layer may be directly on the lateral surface of the active layer.

The light emitting laminate may include at least one mesa region, the lateral surface of the active layer defining a portion of a sidewall of the at least one mesa region.

The passivation layer may cover the sidewall of the mesa region to completely overlap the lateral surface of the active layer.

The semiconductor light emitting device may further include a conductive via extending from the first electrode layer into an interior of the first conductivity type semiconductor layer, the conductive via penetrating through the second conductivity type semiconductor layer and the active layer and being insulated therefrom.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
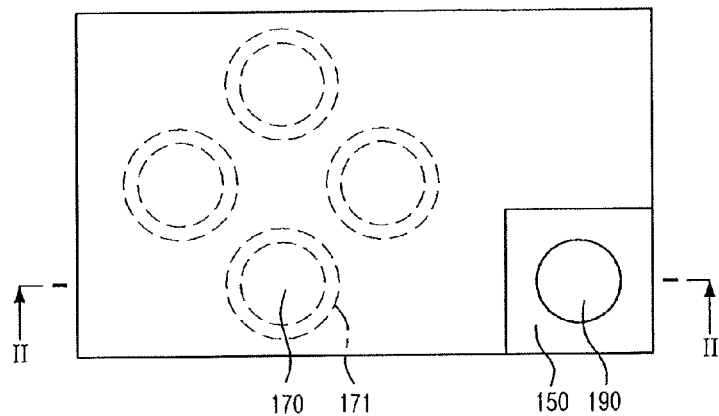
FIG. 1 illustrates a schematic plan view of a semiconductor light emitting device according to an embodiment, when viewed from the above.

Hereinafter, embodiments will be described in detail with reference to the accompanying drawings. Embodiments may, however, be embodied in many different forms and should not be construed as being limited to those set forth herein. Rather, these embodiments are provided so that this disclosure will be thorough and complete, and will fully convey the scope of the exemplary implementations to those skilled in the art.

In the drawings, the shapes and dimensions of elements may be exaggerated for clarity, and the same reference numerals will be used throughout to designate the same or like elements.

Figure 2:
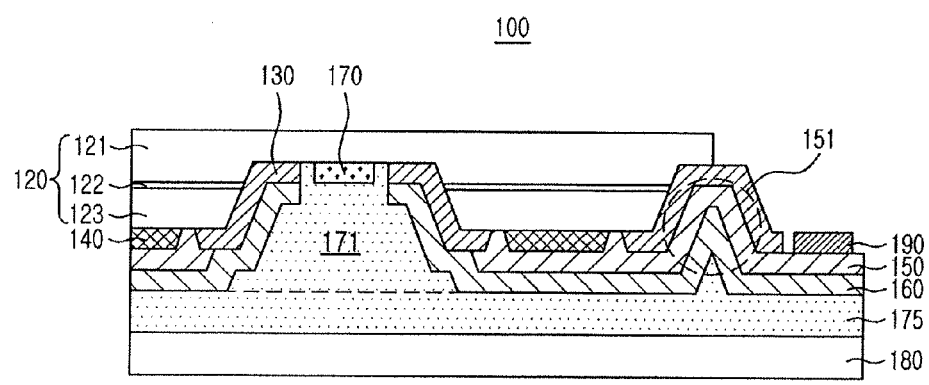
FIG. 2 illustrates a cross-sectional view of the semiconductor light emitting device of FIG. 1, taken along line II-II.

FIG. 1 illustrates a schematic plan view of a semiconductor light emitting device according to an embodiment, when viewed from the above. FIG. 2 is a cross-sectional view along line II-II of FIG. 1.

Referring to FIGS. 1 and 2, a semiconductor light emitting device 100 according to an embodiment may include a first conductivity type semiconductor layer 121, an active layer 122, a second conductivity type semiconductor layer 123 that are sequentially stacked on one another, an etch stop layer 130, a second conductivity type ohmic electrode layer 140, a second electrode layer 150, an insulating layer 160, a first conductivity type ohmic electrode layer 170, a first electrode layer 175, and a conductive substrate 180.

As illustrated in FIG. 2, the first electrode layer 175 may include at least one conductive via 171 in order to be electrically connected to the first conductivity type semiconductor layer 121. The at least one conductive via 171 may be electrically insulated from the second conductivity type semiconductor layer 123 and from the active layer 122, and may extend from a surface of the first electrode layer 175 to at least a portion of the first conductivity type semiconductor layer 121.

The first electrode layer 175 is not necessary required in the embodiment. Although not illustrated, the semiconductor light emitting device 100 may not include the first electrode layer 175, so the conductive via 171 may be formed from a surface of the conductive substrate 180. That is, the conductive substrate 180 may include the at least one conductive via 171 electrically connected to the first conductivity type semiconductor layer 121, the at least one conductive via 171 being electrically insulated from the second conductivity type semiconductor layer 123 and the active layer 122, and extending from a surface of the conductive substrate 180 to at least a portion of the first conductivity type semiconductor layer 121. In this case, the conductive substrate 180 may be electrically connected to an external power source, and the first conductivity type semiconductor layer 121 may receive voltage applied thereto through the conductive substrate 180.

The second electrode layer 150 may include a partial region exposed by etching the first conductivity type semiconductor layer 121, the active layer 122, and the second conductivity type semiconductor layer 123 and etching the etch stop layer 130. A second electrode pad 190 may be formed on the exposed region of the second electrode layer 150. For example, the etch stop layer 130 may be provided to prevent the second electrode layer 150 formed under the etch stop layer 130 from being etched during a process of etching the first conductivity type semiconductor layer 121, the active layer 122, and the second conductivity type semiconductor layer 123 in order to form the second electrode pad 190 electrically connected to the second electrode layer 150 on the partial region of the second electrode layer 150.

Since the semiconductor light emitting device 100 emits light from the first conductivity type semiconductor layer 121, the active layer 122, and the second conductivity type semiconductor layer 123, stacked layers 121 through 123 will be referred to, hereinafter, as a light emitting laminate 120. That is, the semiconductor light emitting device 100 may include the light emitting laminate 120, the first electrode layer 175 electrically connected to the first conductivity type semiconductor layer 121 through the conductive via 171, the second electrode layer 150 electrically connected to the second conductivity type semiconductor layer 123, and the insulating layer 160 electrically insulating the electrode layers 175 and 150 from each other. Here, the first conductivity type semiconductor layer 121 may contact the first conductivity type ohmic electrode layer 170, and the first conductivity type ohmic electrode layer 170 may be electrically connected to the first electrode layer 175. The second conductivity type semiconductor layer 123 may contact the second conductivity type ohmic electrode layer 140, and the second conductivity type ohmic electrode layer 140 may be electrically connected to the second electrode layer 150. In addition, the semiconductor light emitting device 100 may include the conductive substrate 180 serving as a support.

The first and second conductivity type semiconductor layers 121 and 123 are not limited thereto, but may include a semiconductor material, e.g., a GaN based semiconductor, a SiC based semiconductor, a ZnO based semiconductor, a GaAs based semiconductor, a GaP based semiconductor, or a GaAsP based semiconductor. In addition, the first and second conductivity type semiconductor layers 121 and 123 may be properly selected from a group III-V semiconductor, a group IV-IV semiconductor, a group II-VI semiconductor and a group IV semiconductor, e.g., silicon (Si), and mixtures thereof. Also, the first or second conductivity type semiconductor layer 121 or 123 may be formed by doping the above-mentioned semiconductor with an n-type impurity or a p-type impurity in consideration of the conductivity type of semiconductor.

The active layer 122, a layer activating the emission of light, may be formed of a material having an energy band gap smaller than those of the first conductivity type semiconductor layer 121 and the second conductivity type semiconductor layer 123. For example, when the first conductivity type semiconductor layer 121 and the second conductivity type semiconductor layer 123 are formed of a GaN based compound semiconductor, the active layer 122 may be formed using an InAlGaN based compound semiconductor having an energy band gap smaller than that of GaN. For example, the active layer 122 may include $In_xAl_yGa_{(1-x-y)}N(0 \leq x \leq 1, 0 \leq y \leq 1, 0 \leq x+y \leq 1)$.

In this case, the active layer 122 may not be doped with impurities in terms of characteristics thereof, and a wavelength of light emitted therefrom may be adjusted by adjusting mole ratios of composition materials. Therefore, the semiconductor light emitting device 100 may emit one of infrared light, visible light, and ultraviolet light according to the characteristics of the active layer 122.

The first electrode layer 175 and the second electrode layer 150 may be layers provided to apply voltage to the first and second conductivity type semiconductor layers 121 and 123, respectively, having the same conductivity types as those of the first electrode layer 175 and the second electrode layer 150. The first conductivity type semiconductor layer 121 and the second conductivity type semiconductor layer 123 may be electrically connected to an external power source through the first electrode layer 175 and the second electrode layer 150.

Since the first electrode layer 175 may be connected to the first conductivity type semiconductor layer 121 and the second electrode layer 150 may be connected to the second conductivity type semiconductor layer 123, they are electrically isolated from each other through the insulating layer 160. The insulating layer 160 may be formed of a material having a low degree of electrical conductivity, e.g., an oxide such as $SiO_2$.

The first electrode layer 175 may include the at least one conductive via 171 electrically insulated from the second conductivity type semiconductor layer 123 and the active layer 122 and extending to a portion of the first conductivity type semiconductor layer 121, in order to be electrically connected to the first conductivity type semiconductor layer 121. The conductive via 171 may penetrate through the etch stop layer 130, which surrounds the second conductivity type semiconductor layer 123, and through the active layer 122, and may extend to the first conductivity type semiconductor layer 121 and include an electrode material. The first electrode layer 175 and the first conductivity type semiconductor layer 121 may be electrically connected to each other through the conductive via 171, such that the first conductivity type semiconductor layer 121 may be connected to an external power source.

That is, the conductive via 171 may penetrate through the second electrode layer 150, the second conductivity type semiconductor layer 123, the active layer 122, and the etch stop layer 130 to be extended to an interior of the first conductivity type semiconductor layer 121. The conductive via 171 may be extended to at least an interface between the active layer 122 and the first conductivity type semiconductor layer 121, e.g., or to a portion at a predetermined distance within the first conductivity type semiconductor layer 121. However, since the conductive via 171 is provided for the electrical connection and current spread of the first conductivity type semiconductor layer 121, it may not be necessary for the conductive via 171 to be extended to an external surface of the first conductivity type semiconductor layer 121 as long as it contacts the first conductivity type semiconductor layer 121.

In addition, since the conductive via 171 is provided to spread current in the first conductivity type semiconductor layer 121, it may have a predetermined area. A predetermined number of conductive vias 171 having an area as small as possible while remaining sufficient for current to be uniformly spread in the first conductivity type semiconductor layer 121 may be provided. When an excessively small number of the conductive vias 171 are formed, it may be difficult to implement current spreading, thereby deteriorating electrical characteristics. When an excessively large number of the conductive vias 171 are formed, a reduction in a light emitting area may be caused due to difficulties in processing and a reduction of an area of an active layer. Therefore, the number of conductive vias 171 may be appropriately selected.

If the conductive via 171 is only provided for the electrical connection of the first conductivity type semiconductor layer 121, the first electrode layer 175 may include one conductive via 171. That is, the conductive via 171 may have a shape having an area as small as possible while effectively spreading current.

The conductive via 171 may be formed from the first electrode layer 175 to the interior of the first conductivity type semiconductor layer 121. Since the conductive via 171 is provided to spread current in the first conductivity type semiconductor layer 121, it may be necessary to electrically separate the conductive via 171 from the second conductivity type semiconductor layer 123 and the active layer 122. Thus, the insulating layer 160 may be extended so as to cover a circumference of the conductive via 171. Although not separately illustrated in the drawings, the insulating layer 160 may include a first insulating layer extended so as to cover the circumference of the conductive via 171 and a second insulating layer electrically insulating the first electrode layer 175 and the second electrode layer 150 from each other.

The second electrode layer 150 may be disposed below the active layer 122 and positioned on a side opposite to a direction in which semiconductor light emitting device 100 emits light, based on the active layer 122. Thus, luminous efficiency may be increased by reflecting light directed to the second electrode layer 150.

The second electrode layer 150 may be formed of a white metal in a visible ray area in order to reflect light generated from the active layer 122 and include at least one of, e.g., Ag, Ni, Al, Rh, Pd, Ir, Ru, Mg, Zn, Pt, Au and the like. The second electrode layer 150 may include a partial region exposed by etching the first conductivity type semiconductor layer 121, the active layer 122, and the second conductivity type semiconductor layer 123 and etching the etch stop layer 130.

In detail, while the first electrode layer 175 may contact the conductive substrate 180 disposed thereunder to be connected to an external power source, the second electrode layer 150 may require a separate connection region in order to be connected to an external power source. Thus, the second electrode layer 150 may have a partial region exposed by etching a portion of the light emitting laminate 120 and etching the exposed etch stop layer 130. By doing so, the second conductivity type semiconductor layer 123 may be connected to an external power source through the second electrode layer 150. That is, the exposed partial region of the second electrode layer 150 may be provided to electrically connect the second electrode layer 150 and an external power source.

In this case, the exposed partial region of the second electrode layer 150, in which the second electrode layer 150 is electrically connected to an external power source, may include a protruded region 151 of the second electrode layer 150. That is, portions of the light emitting laminate 120 and the etch stop layer 130 formed in a direction oriented away from the conductive via 171, based on the protruded region 151 of the second electrode layer 150, may be etched. For example, as illustrated in FIG. 2, the light emitting laminate 120 may partially overlap the protruded portion 151.

The second electrode pad 190 may be formed on a partial region of the second electrode layer 150 exposed by etching the etch stop layer 130. That is, the second electrode pad 190 may be formed on the partial region of the second electrode layer 150 extended to the exterior of the light emitting laminate 120, i.e., the second electrode pad 190 may be outside, e.g., external to, the light emitting laminate 120.

When the second electrode layer 150 has the protruded region 151 as described above, since the light emitting laminate 120 may be surrounded by the conductive via 171 and the protruded region 151 of the second electrode layer 150, the active layer 122 of the light emitting laminate 120 may not be exposed to the outside. Specifically, at least a lateral surface of the active layer 122 of the light emitting laminate 120 may be surrounded by the etch stop layer 130 formed on an upper surface of the protruded region 151 of the second electrode layer 150. That is, the etch stop layer 130 may simultaneously serve as a passivation layer in order to prevent the active layer 122 from being outwardly exposed. Thus, separately forming a passivation layer so as to prevent the active layer 122 from being exposed may be unnecessary, and a process for exposing a portion of the passivation layer in order to form an electrode on the second electrode layer 150 may be omitted to allow for a simplified process.

The exposed region of the second electrode layer 150 may be formed through selective etching such that only a portion of the light emitting laminate 120 and the etch stop layer 130 are etched, while the second electrode layer 150 including a general metal is not etched. Thus, the etch stop layer 130 may be formed on the partial region of the second electrode layer 150. The etch stop layer 130 may prevent a metal forming the second electrode layer 150 from being bonded to a lateral surface of the light emitting laminate 120 to decrease a leakage current, such that etching may be facilitated. The etch stop layer 130 may be formed of a material suppressing the light emitting laminate 120 from being etched, an insulating material such as a silicon oxide or a silicon nitride, e.g., $SiO_2$, $SiO_xN_y$, $Si_xN_y$ and the like. However, the etch stop layer 130 is not limited thereto.

Thus, the etch stop layer 130 may serve as an insulating layer electrically insulating the conductive via 171 from the second conductivity type semiconductor layer 123 and the active layer 122.

In addition, as the etch stop layer 130 formed on the partial region of the second electrode layer 150 is etched, the second electrode pad 190 may be formed on the exposed region of the second electrode layer 150. Thus, the second electrode pad 190 may be electrically connected to the second electrode layer 150.

The conductive substrate 180 may be disposed on a lower surface of the first electrode layer 175 and may come into contact with the first electrode layer 175 to be electrically connected thereto. The conductive substrate 180 may be a metallic substrate or a semiconductor substrate. The conductive substrate 180 may be formed of a material including one of Au, Ni, Al, Cu, W, Si, Se, GaAs, e.g., a material including copper (Cu) alone or a combination of silicon (Si) and aluminum (Al). In this case, the conductive substrate 180 may be formed by a method such as plating, bonding or the like, according to the selection of a material. The conductive substrate 180 may be a support substrate bonded to the first electrode layer 175 through the removal of a sapphire substrate after the sapphire substrate is used as a growth substrate.

FIGS. 3A through 3K illustrate views of stages in a manufacturing process of a semiconductor light emitting device according an embodiment. The process stages are illustrated in line with the cross-section along line II-II of FIG. 1.

Figure 3A:
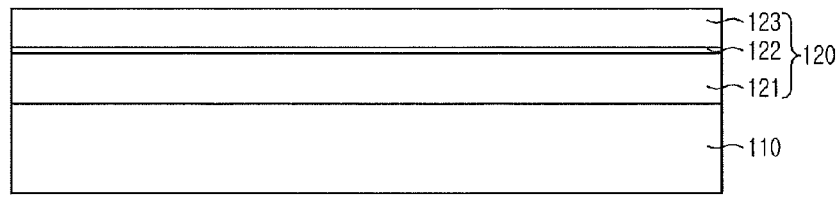
FIGS. 3A through 3K illustrate views of stages in a manufacturing process of a semiconductor light emitting device according an embodiment, in line with a process of forming a cross-section of the semiconductor light emitting device of FIG. 1, taken along line II-II.

As illustrated in FIG. 3A, the light emitting laminate 120 may be formed by sequentially growing the second conductivity type semiconductor layer 123, the active layer 122, and the first conductivity type semiconductor layer 121 on a semiconductor growth substrate 110. Layers 121 through 123 may be formed using a semiconductor layer growth process, e.g., metal organic chemical vapor deposition (MOCVD), molecular beam epitaxy (MBE), hydride vapor phase epitaxy (HVPE) or the like. The semiconductor growth substrate 110 may be a substrate formed of a material including, e.g., sapphire, SiC, $MgAl_2O_4$, MgO, $LiAlO_2$, $LiGaO_2$, GaN or the like. In this case, sapphire is a crystal having Hexa-Rhombo R3C symmetry and has a lattice constant of 13.001 Å in a C-axis direction and a lattice constant of 4.758 Å in an A-axis direction. The sapphire includes a C (0001) plane, an A (1120) plane, an R (1102) plane, and the like. In this case, the C plane is mainly used as a nitride growth substrate because the C plane relatively facilitates the growth of a nitride film and is stable at high temperatures.

Figure 3B:
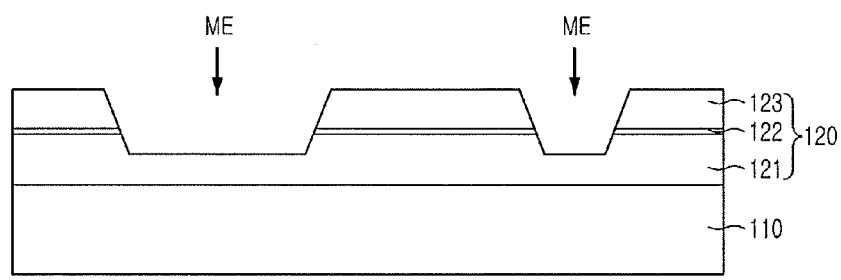

Next, as illustrated in FIG. 3B, the portions of the second conductivity type semiconductor layer 123, the active layer 122, and the first conductivity type semiconductor layer 121 may be selectively removed through mesa etching to expose regions of the first conductivity type semiconductor layer 121. That is, as illustrated in FIG. 3B, the mesa etched regions MEs may be deep enough to extend completely through the active layer 122 and partially through the first conductivity type semiconductor layer 121. The mesa etched regions MEs may correspond to regions in which the conductive via 171 and the protruded region 151 of the second electrode layer 150 will be formed. Thus, when a plurality of conductive vias 171 is formed, the number of mesa etched regions MEs may be increased.

Figure 3C:
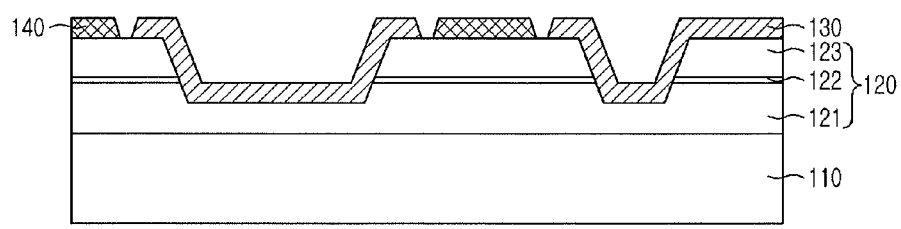

Next, as illustrated in FIG. 3C, the etch stop layer 130 formed of an insulating material may be formed, e.g., conformally, on the entire surface of the light emitting laminate 120. Since the etch stop layer 130 is formed of an insulating material, it may be formed on the entire surface of the light emitting laminate 120 in order to serve as an insulating layer electrically insulating the conductive via 171, to be formed later, from the second conductivity type semiconductor layer 123 and the active layer 122. For example, as illustrated in FIG. 3C, the etch stop layer 130 completely covers sidewalls of the mesa regions ME, so lateral edges of the active layer 122, i.e., lateral edges facing the mesa regions ME, may be completely covered.

Thereafter, photoresist may be formed on the etch stop layer 130 in order to expose a region of the second conductivity type semiconductor layer 123, on which the second conductivity type ohmic electrode layer 140 will be formed. Thus, the etch stop layer 130 may be etched using photoresist as a mask. Then, the second conductivity type ohmic electrode layer 140 may be formed on the region of the second conductivity type semiconductor layer 123, exposed by etching the etch stop layer 130. The second conductivity type ohmic electrode layer 140 may include, e.g., Ag, Ni, Al, Rh, Pd, Ir, Ru, Mg, Zn, Pt, Au, Cu, Zn, In, Ti, Si, Ge, Sn, Ta, Cr, W, or the like, in consideration of light reflective functions and ohmic contact characteristics with the second conductivity type semiconductor layer 123, and a process such as sputtering, deposition or the like may be properly used to form the second conductivity type ohmic electrode layer 140.

Although the etch stop layer 130 and the second conductivity type ohmic electrode layer 140 are not in contact with each other in the drawings, they may be formed to contact each other according to a processing margin.

Figure 3D:
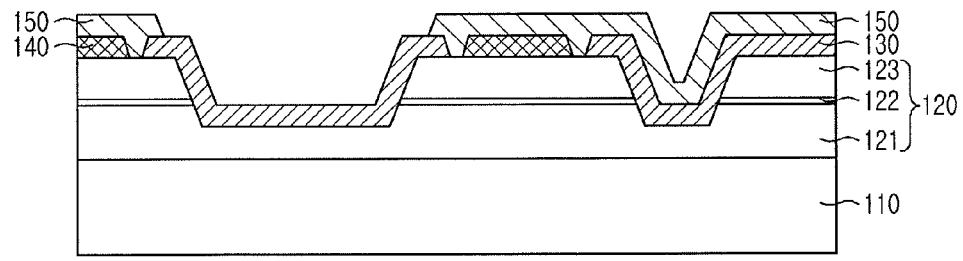

Next, as illustrated in FIG. 3D, the second electrode layer 150 may be formed over the second conductivity type ohmic electrode layer 140 and over a portion of the etch stop layer 130. As the second electrode layer 150 is formed conformally on the etch stop layer 130 in the mesa region ME, the protruded portion 151 of the second electrode layer 150 is defined in the mesa region ME. The second electrode layer 150 may be formed of a material having excellent electrical conductivity and light reflectivity, e.g., at least one of Ag, Ni, Al, Rh, Pd, Ir, Ru, Mg, Zn, Pt, Au, Cu, Zn, In, Ti, Si, Ge, Sn, Ta, Cr, W or the like. A process such as sputtering, deposition or the like may be appropriately used to form the second electrode layer 150.

Figure 3E:
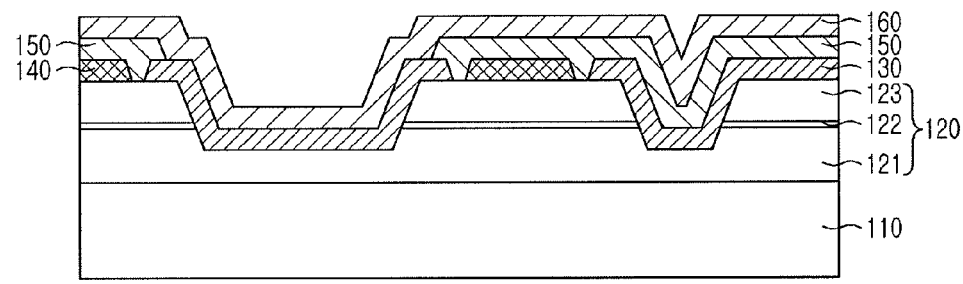

Next, as illustrated in FIG. 3E, the insulating layer 160 may be formed on the entire surface of a structure provided with the second electrode layer 150.

Figure 3F:
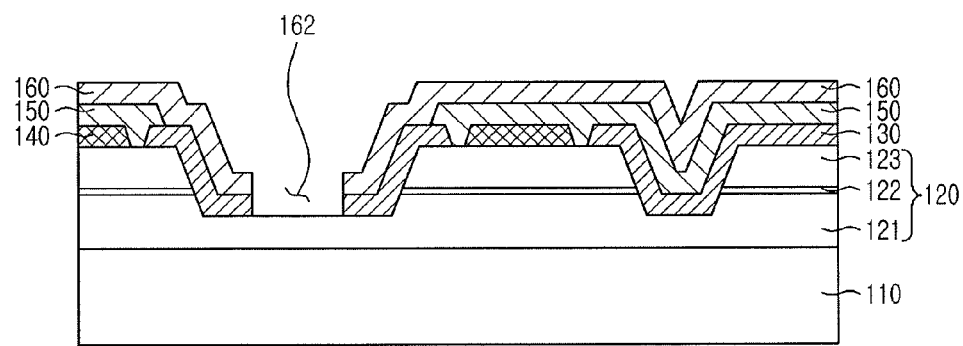

Next, as illustrated in FIG. 3F, a partial region 162 of the insulating layer 160 and the etch stop layer 130, i.e., a region in which the conductive via 171 will be formed, may be etched to expose a portion of the first conductivity type semiconductor layer 121. The etching may be performed using an etching process, e.g., inductively coupled plasma-reactive ion etching (ICP-RIE) or the like.

Figure 3G:
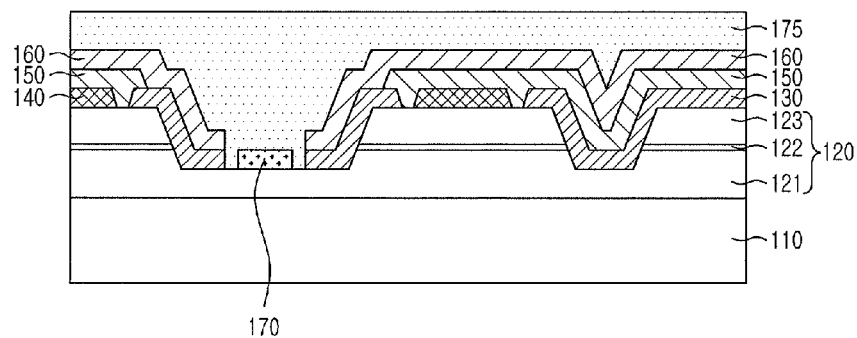

Next, as illustrated in FIG. 3G, the first conductivity type ohmic electrode layer 170 may be formed on the exposed portion of the first conductivity type semiconductor layer 121. The first conductivity type ohmic electrode layer 170 may include, e.g., at least one of Ag, Ni, Al, Rh, Pd, Ir, Ru, Mg, Zn, Pt, Au, Cu, Zn, In, Ti, Si, Ge, Sn, Ta, Cr, W or the like, in consideration of ohmic contact characteristics with the first conductivity type semiconductor layer 121. A process such as sputtering, deposition or the like may be properly used to form the first conductivity type ohmic electrode layer 170.

Then, the first electrode layer 175 may be formed over the entire surface of the structure provided with the first conductivity type ohmic electrode layer 170, using a material having a high degree of electrical conductivity.

Figure 3H:
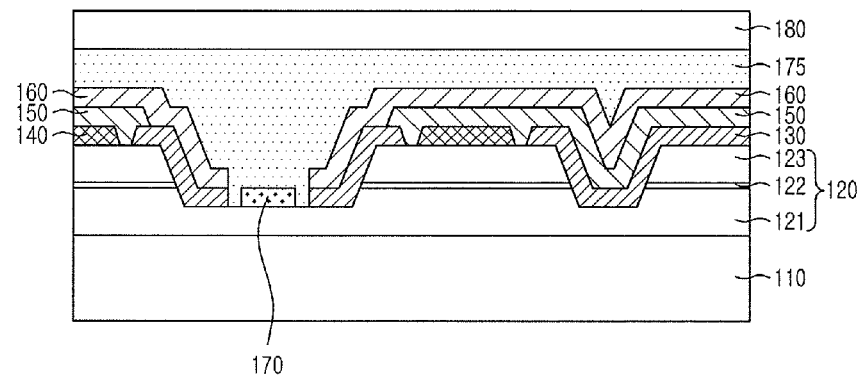

Next, as illustrated in FIG. 3H, the conductive substrate 180 may be formed on the first electrode layer 175. Accordingly, the conductive substrate 180 may be electrically connected to the conductive via 171 connected to the first conductivity type semiconductor layer 121. The conductive substrate 180 may include, e.g., at le sat one of Au, Ni, Al, Cu, W, Si, Se, and GaAs, and may be properly formed through a process such as plating, sputtering, deposition, adhesion or the like.

In this case, the first electrode layer 175 may be formed of the same material as that of the conductive substrate 180. However, the first electrode layer 175 may be formed of a different material from the conductive substrate 180, such that they are formed through separate processes. For example, the conductive substrate 180 may be previously formed after the first electrode layer 175 is formed through a deposition process, and then may be bonded to the light emitting laminate 120.

Figure 3I:
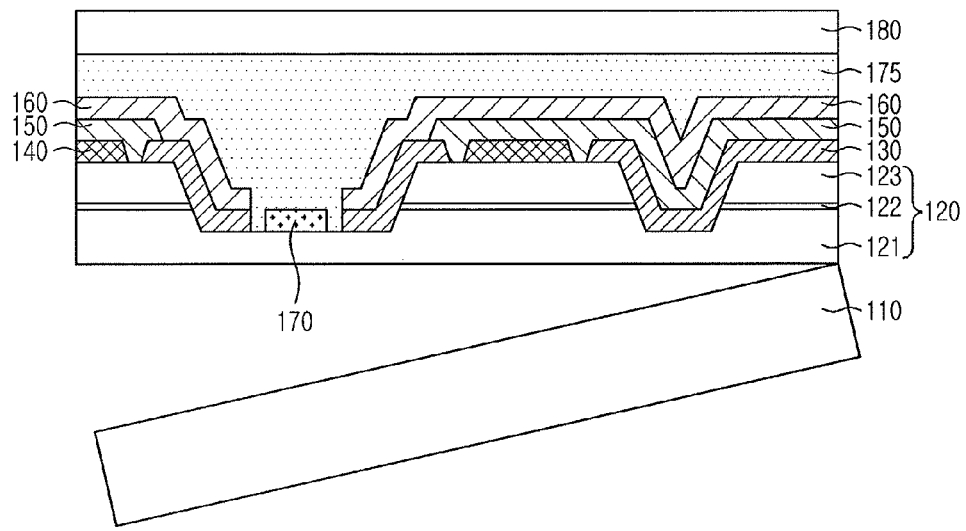

Next, as illustrated in FIG. 3I, the semiconductor growth substrate 110 may be removed so as to expose the first conductivity type semiconductor layer 121. In this case, the semiconductor growth substrate 110 may be removed using a process such as a laser lift off process, a chemical lift off process, or the like.

Figure 3J:
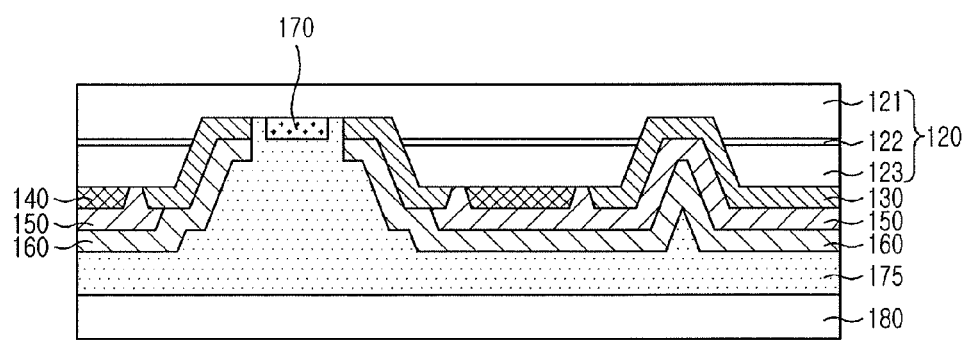

FIG. 3J illustrates a view of an embodiment of FIG. 3I in a state of being reversed, in which the semiconductor growth substrate 110 is removed.

Figure 3K:
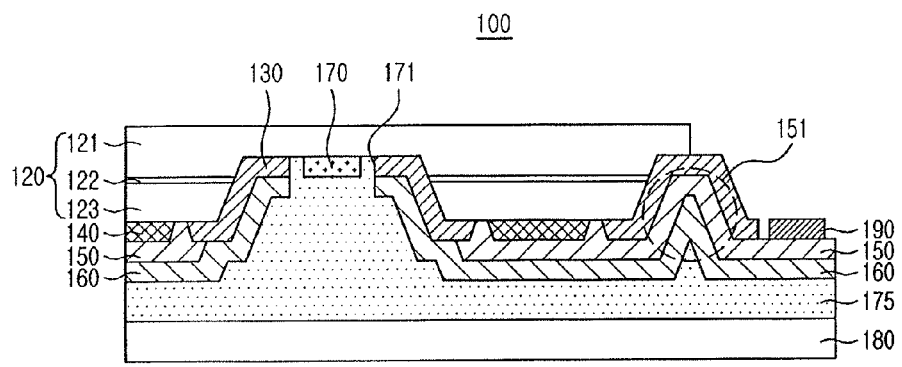

Next, as illustrated in FIG. 3K, a portion of the light emitting laminate 120 formed in a direction away from the conductive via 171 based on the protruded region 151 of the second electrode layer 150 may be etched. The etching may be performed using an etching process, e.g., inductively coupled plasma-reactive ion etching (ICP-RIE) or the like. In this case, the second electrode layer 150 may not be etched due to the etch stop layer 130. Then, after a portion of the etch stop layer 130 is removed through wet etching, the second electrode pad 190 may be formed on the second electrode layer 150.

When the semiconductor light emitting device 100 is formed by mesa etching partial regions of the light emitting laminate 120 corresponding to the regions in which the conductive via 171 and the protruded region 151 of the second electrode layer 150 will be formed, and etching the portions of the light emitting laminate 120 and the etch stop layer 130 formed in a direction away from the conductive via 171 based on the protruded region 151 of the second electrode layer 150 after the first electrode layer 175 and the second electrode layer 150 are formed, the active layer 122 of the light emitting laminate 120 may be not exposed to the outside. Thus, it may be unnecessary to form a passivation layer separately so as to prevent the active layer 122 from being outwardly exposed. In addition, a process for exposing a partial region of a passivation layer in order to form an electrode on the second electrode layer 150 may be omitted to allow for a simplified process.

Figure 4:
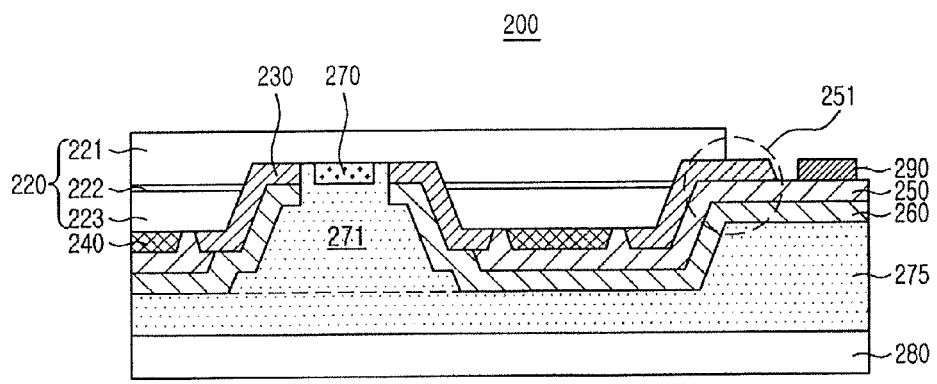
FIG. 4 illustrates a cross-sectional view of a semiconductor light emitting device according to another embodiment.

FIG. 4 illustrates a cross-sectional view of a semiconductor light emitting device according to another embodiment. In the embodiment of FIG. 4, a shape of a region in which a second electrode is formed is different from that in FIG. 2, but other components are the same as those of the foregoing embodiment. Thus, only the different component will be described hereinafter.

Referring to FIG. 4, a semiconductor light emitting device 200 according to another embodiment may include a first conductivity type semiconductor layer 221, an active layer 222, a second conductivity type semiconductor layer 223 that are sequentially stacked on one another, an etch stop layer 230, a second conductivity type ohmic electrode layer 240, a second electrode layer 250, an insulating layer 260, a first conductivity type ohmic electrode layer 270, a first electrode layer 275, and a conductive substrate 280.

As illustrated in FIG. 4, the second electrode layer 250, on which the second electrode pad 290 will be formed, may have a region bent toward a light emitting laminate 220. That is, a portion of the light emitting laminate 220 formed in a direction away from a conductive via 271 based on a bent region 251 of the second electrode layer 250, may be etched. For example, as illustrated in FIG. 4, the bent region 251 may extend linearly on the insulation layer 260 beyond the light emitting laminate 220

When the second electrode layer 250 has the bent region 251 as described above, the light emitting laminate 220 may be surrounded by the conductive via 271 and the bend region 251 of the second electrode layer 250. Specifically, at least a lateral surface of the active layer 222 of the light emitting laminate 220 may be surrounded by the etch stop layer 230 formed on an upper surface of the bent region 251 of the second electrode layer 250. That is, the etch stop layer 230 may simultaneously serve as a passivation layer in order to prevent the active layer 222 from being exposed.

Thus, since the active layer 222 of the light emitting laminate 220 is not exposed to the outside, separately forming a passivation layer so as to prevent the active layer 222 from being exposed may be unnecessary. In addition, a process for exposing a portion of the passivation layer in order to form an electrode on the second electrode layer 150 may be omitted to allow for a simplified process.

FIGS. 5A through 5K illustrate views of stages in a manufacturing process of a semiconductor light emitting device according to another embodiment.

Figure 5A:
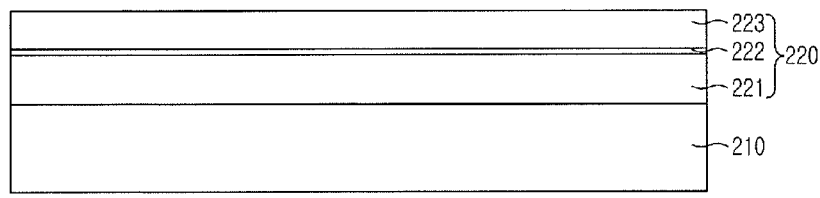
FIGS. 5A through 5K illustrates views of stages in a manufacturing process of a semiconductor light emitting device according to another embodiment, in line with a formation process.

As illustrated in FIG. 5A, the light emitting laminate 220 may be formed by sequentially growing the second conductivity type semiconductor layer 223, the active layer 222, and the first conductivity type semiconductor layer 221 on a semiconductor growth substrate 210 using a semiconductor layer growth process such as metal organic chemical vapor deposition (MOCVD), molecular beam epitaxy (MBE), hydride vapor phase epitaxy (HVPE) or the like.

Figure 5B:
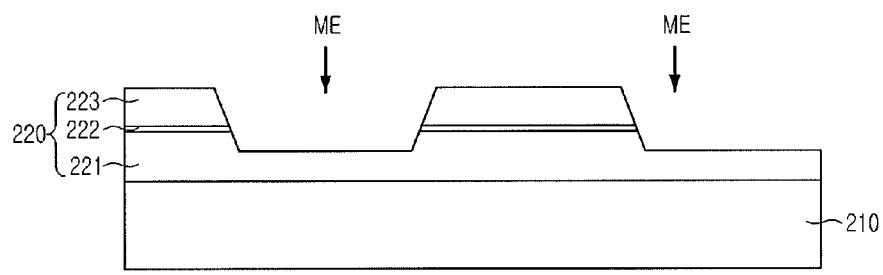

Next, as illustrated in FIG. 5B, the second conductivity type semiconductor layer 223, the active layer 222, and a portion of the first conductivity type semiconductor layer 221 may be selectively removed through mesa etching to expose regions of the first conductivity type semiconductor layer 221. Mesa etched regions MEs may correspond to regions in which the conductive via 271 and the bent region 251 of the second electrode layer 250 are formed.

Figure 5C:
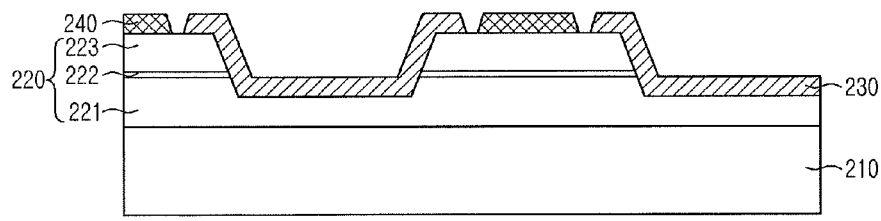

Next, as illustrated in FIG. 5C, the etch stop layer 230 may be formed on the entire surface of the mesa etched light emitting laminate 220, and photoresist may be formed on the etch stop layer 230 in order to expose a region of the second conductivity type semiconductor layer 223 on which the second conductivity type ohmic electrode layer 240 will be formed. Thus, the etch stop layer 230 may be etched using photoresist as a mask. Then, the second conductivity type ohmic electrode layer 240 may be formed in the region of the second conductivity type semiconductor layer 223, exposed by etching the etch stop layer 230. Although the case in which the etch stop layer 230 and the second conductivity type ohmic electrode layer 240 are not in contact with each other is illustrated in FIG. 5C, the etch stop layer 230 and the second conductivity type ohmic electrode layer 240 may be formed to contact each other according to a processing margin.

Figure 5D:
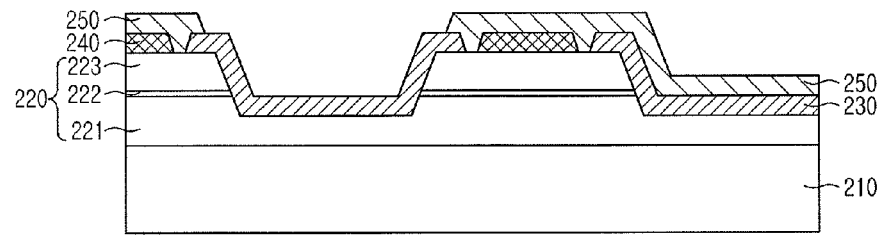

Next, as illustrated in FIG. 5D, the second electrode layer 250 may be formed over the second conductivity type ohmic electrode layer 240.

Figure 5E:
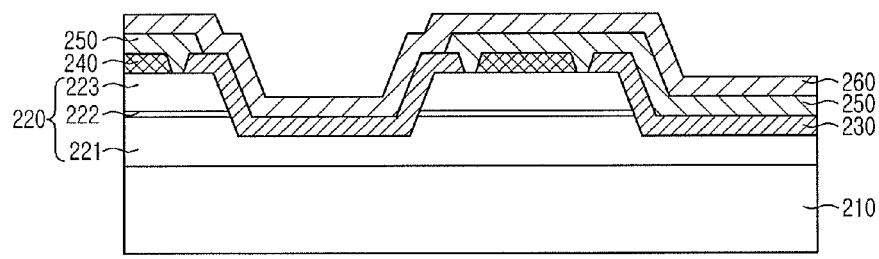

Next, as illustrated in FIG. 5E, the insulating layer 260 may be formed on the entire surface of a structure provided with the second electrode layer 250.

Figure 5F:
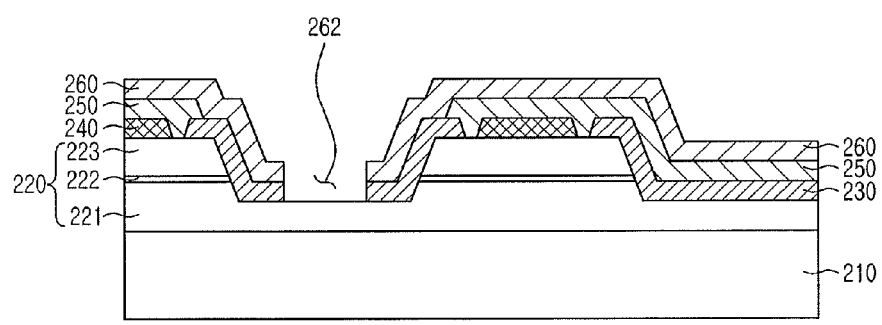

Next, as illustrated in FIG. 5F, a partial region 262 of the insulating layer 260 and the etch stop layer 230, i.e., a region in which the conductive via 271 will be formed, may be etched to expose a portion of the first conductivity type semiconductor layer 221. The etching may be performed using an etching process, e.g., inductively coupled plasma-reactive ion etching (ICP-RIE) or the like.

Figure 5G:
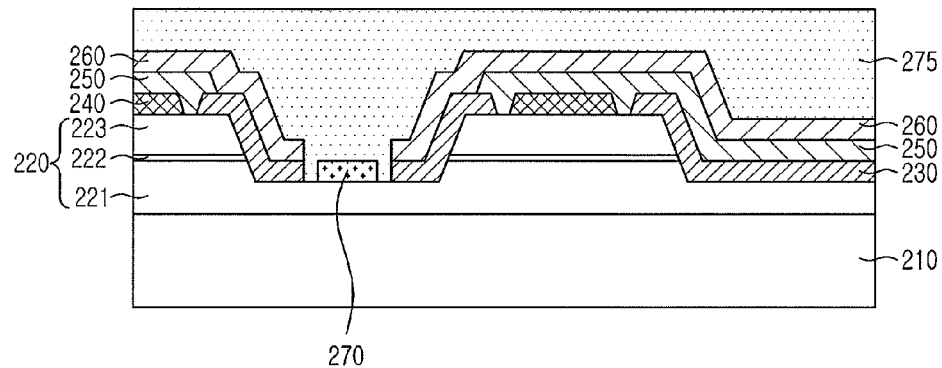

Next, as illustrated in FIG. 5G, the first conductivity type ohmic electrode layer 270 may be formed on the exposed portion of the first conductivity type semiconductor layer 221. Then, the first electrode layer 275 may be formed over the entire surface of a structure provided with the first conductivity type ohmic electrode layer 270.

Figure 5H:
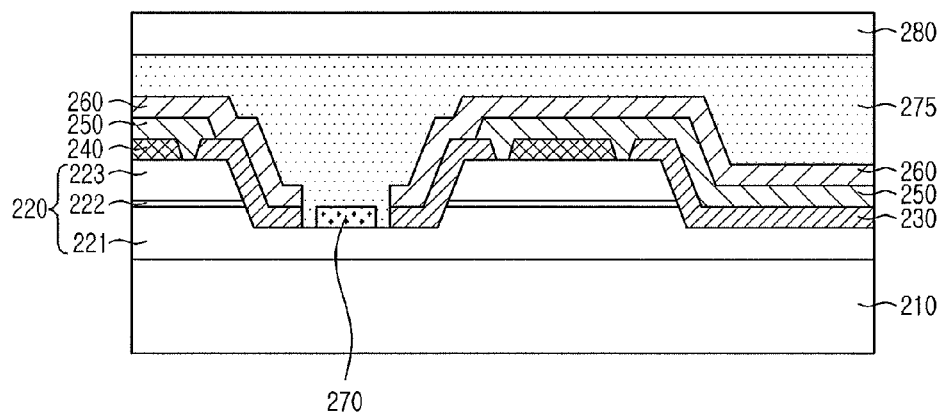

Next, as illustrated in FIG. 5H, the conductive substrate 280 may be formed on the first electrode layer 275. Accordingly, the conductive substrate 280 may be electrically connected to the conductive via 271 connected to the first conductivity type semiconductor layer 221.

Figure 5I:
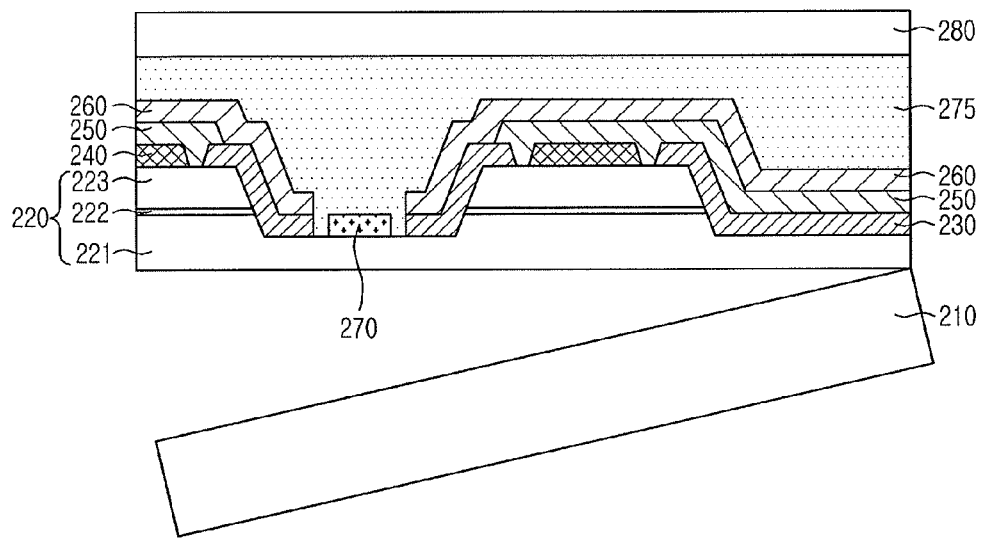

Next, as illustrated in FIG. 5I, the semiconductor growth substrate 210 may be removed so as to expose the first conductivity type semiconductor layer 221. In this case, the semiconductor growth substrate 210 may be removed using a process such as a laser lift off process, a chemical lift off process, or the like.

Figure 5J:
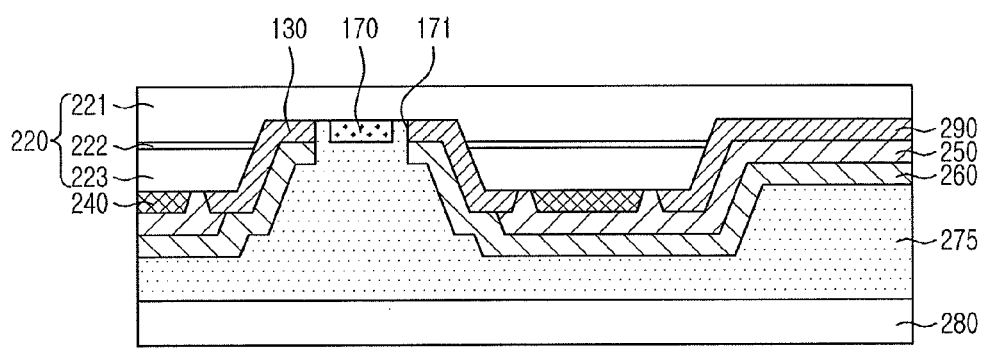

FIG. 5J illustrates a view of an embodiment of FIG. 5I in a state of being reversed, in which the semiconductor growth substrate 210 is removed.

Figure 5K:
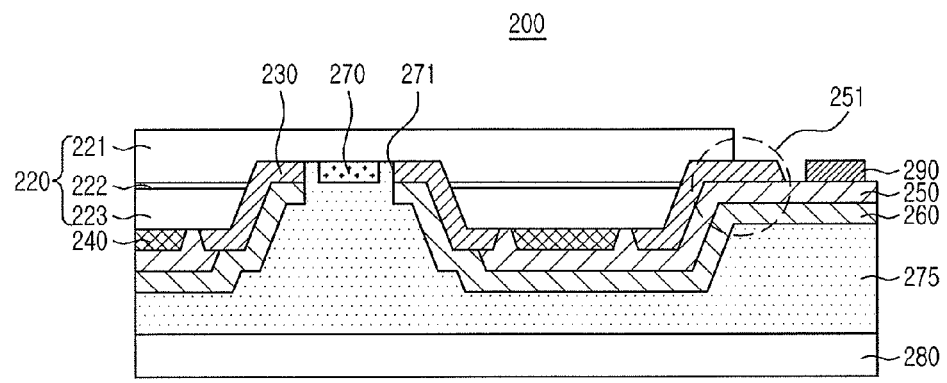

Next, as illustrated in FIG. 5K, a portion of the light emitting laminate 220 formed in a direction away from conductive via 271, based on the bent region 251 of the second electrode layer 250 may be etched. The etching may be performed using an etching process, e.g., inductively coupled plasma-reactive ion etching (ICP-RIE) or the like. In this case, the second electrode layer 250 may not be etched due to the etch stop layer 230. Then, after a portion of the etch stop layer 230 is removed through wet etching, the second electrode pad 290 may be formed on the second electrode layer 250.

Figure 6:
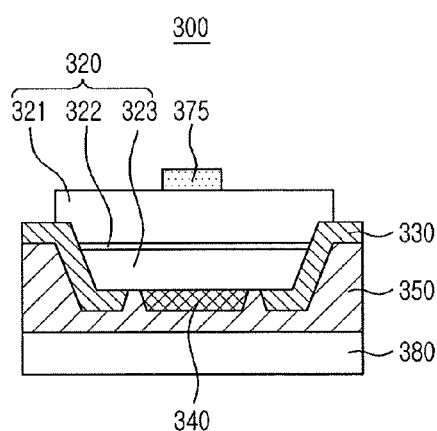
FIG. 6 illustrates a cross-sectional view of a semiconductor light emitting device according to another embodiment.

FIG. 6 illustrates a cross-sectional view of a semiconductor light emitting device according to another embodiment. FIG. 6 shows a vertical-type semiconductor light emitting device. The embodiment of FIG. 6 is merely different from the foregoing embodiment in terms of dispositions and shapes of the first electrode layer and the second electrode layer, and other components according to the embodiment of FIG. 6 are the same as those of the foregoing embodiment. Thus, different components thereof will be described hereinafter.

Referring to FIG. 6, a semiconductor light emitting device 300 according to another embodiment may include a first conductivity type semiconductor layer 321, an active layer 322, a second conductivity type semiconductor layer 323 that are sequentially stacked on one another, an etch stop layer 330, a second conductivity type ohmic electrode layer 340, a second electrode layer 350, a first electrode layer 375, and a conductive substrate 380.

As illustrated in FIG. 6, the second conductivity type semiconductor layer 323 may be electrically connected to the conductive substrate 380 through the second electrode layer 350. In addition, the first electrode layer 375 may be formed on an upper surface of a light emitting laminate 320.

The etch stop layer 330 may perform an etching blocking function when the light emitting laminate 320 is etched to form individual semiconductor light emitting devices 300. In addition, the etch stop layer 330 may serve as an insulating layer electrically insulating the second electrode layer 350 from the first conductivity type semiconductor layer 321 and the active layer 322. Thus, since the active layer 322 of the light emitting laminate 320 is not exposed to the outside, the active layer 322 may be protected therefrom.

Figure 7:
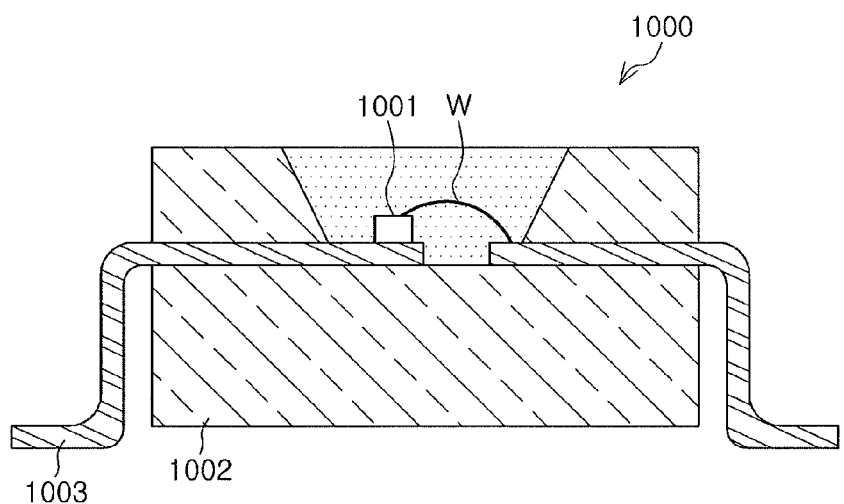
FIGS. 7 through 8 illustrate views of examples of a package with a semiconductor light emitting device according to an embodiment.
Figure 8:
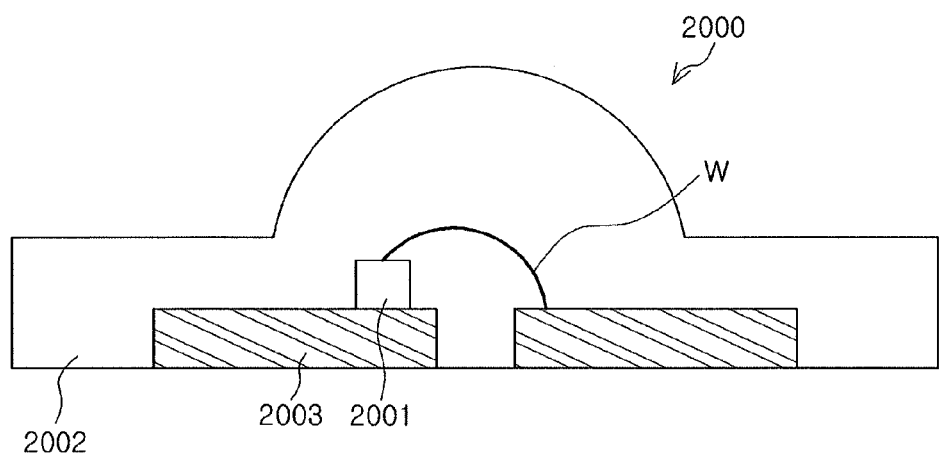

FIGS. 7 through 8 are views respectively illustrating an example of applying a semiconductor light emitting device according to an embodiment to a package. A package 1000 of FIG. 7 includes a semiconductor light emitting device 1001, a package main body 1002 and a pair of lead frames 1003. The semiconductor light emitting device 1001 may be mounted on the lead frame 1003 to be electrically connected thereto through a wire W. The semiconductor light emitting device 1001 may be mounted on another portion of the package 1000 rather than the lead frame 1003, e.g., on the package main body 1002. The package main body 1002 may have a cup shape as shown in FIG. 7 in order to improve light reflection efficiency, and such a reflective cup may be filled with a light transmissive material encapsulating the semiconductor light emitting device 1001 and the wire W. The semiconductor light emitting device 1001 may have the structure of FIG. 2.

A package 2000 of FIG. 8 illustrates similar to the above-mentioned package 1000, in that a semiconductor light emitting device 2001 is mounted on the lead frame 2003 to be electrically connected thereto through a wire W. On the other hand, the package 2000 is different from the package 1000, in that a bottom surface of the lead frame 2003 is exposed outwardly so as to improve the dissipation of heat and the shape of the package 2000 is maintained by a light transmissive main body 2002 encapsulating the semiconductor light emitting device 2001, the wire W and the lead frame 2003. The semiconductor light emitting device 2001 may have the above-described structure.

Figure 9:
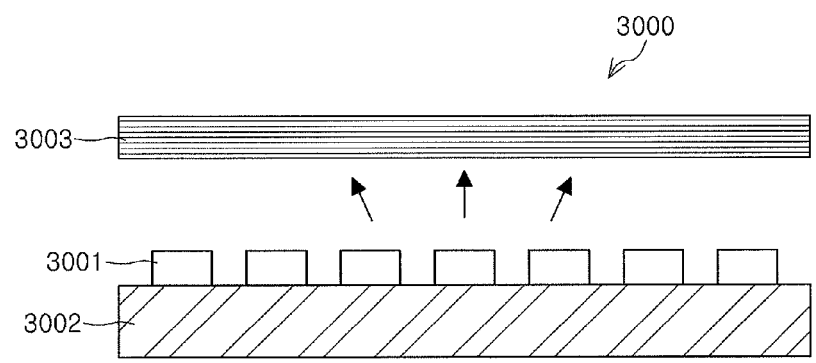
FIGS. 9 through 10 illustrates views of examples of a backlight unit with a semiconductor light emitting device according to an embodiment.
Figure 10:
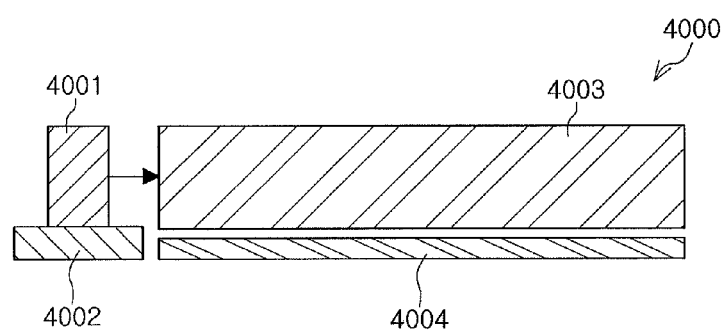

FIGS. 9 through 10 are views respectively illustrating an example of applying a semiconductor light emitting device according to an embodiment to a backlight unit. With reference to FIG. 9, a backlight unit 3000 includes a light source 3001 mounted on a substrate 3002 and at least one optical sheet 3003 disposed thereabove. The light source 3001 may be a light emitting device package having the above-described structure or a structure similar thereto. Alternatively, a semiconductor light emitting device may be directly mounted on the substrate 3002 in a chip-on-board (COB) scheme. The light source 3001 in the backlight unit 3000 of FIG. 9 emits light toward a liquid crystal display (LCD) device disposed thereabove. On the other hand, a light source 4001 mounted on a substrate 4002 in a backlight unit 4000 of FIG. 10 emits light laterally and the emitted light is incident to a light guide plate 4003 such that the backlight unit 4000 may serve as a surface light source. The light that has passed through the light guide plate 4003 may be emitted upwardly and a reflective layer 4004 may be formed under a bottom surface of the light guide plate 4003 in order to improve light extraction efficiency.

Figure 11:
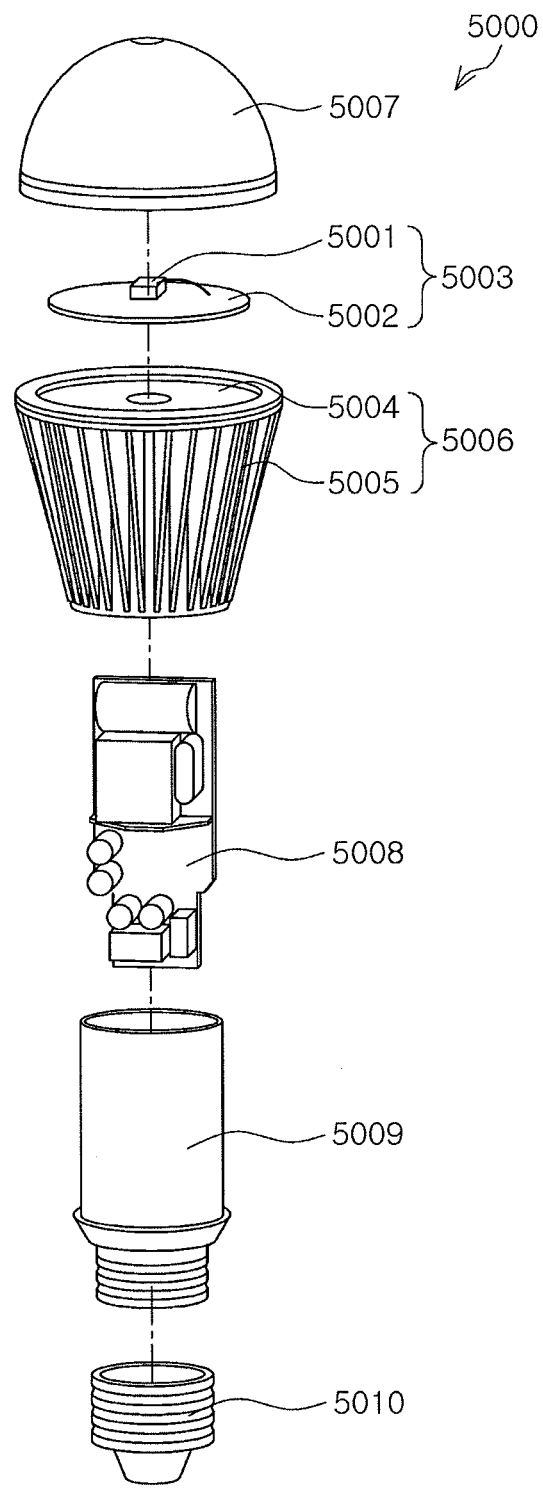
FIG. 11 illustrates a view of an example of a lighting device according to an embodiment.

FIG. 11 is a view illustrating an example of applying a semiconductor light emitting device according to an embodiment to a lighting device. With reference to an exploded perspective view of FIG. 11, a lighting device 5000 is exemplified as a bulb-type lamp, and includes a light emitting module 5003, a driving unit 5008 and an external connector unit 5010. In addition, exterior structures such as an external housing 5006, an internal housing 5009, a cover unit 5007 and the like may be additionally included. The light emitting module 5003 may include a semiconductor light emitting device 5001 and a circuit board 5002 having the semiconductor light emitting device 5001 mounted thereon. In the embodiment, a single semiconductor light emitting device 5001 is mounted on the circuit board 5002; however, if necessary, a plurality of semiconductor light emitting devices may be mounted thereon. In addition, the semiconductor light emitting device 5001 may be manufactured in the form of a package and then mounted on the circuit board 5002, rather than being directly mounted thereon.

In the lighting device 5000, the light emitting module 5003 may include the external housing 5006 serving as a heat radiating part, and the external housing 5006 may include a heat sink plate 5004 in direct contact with the light emitting module 5003 to improve the dissipation of heat and a plurality of heat radiating fins 5005. In addition, the lighting device 5000 may include the cover unit 5007 disposed above the light emitting module 5003 and having a convex lens shape. The driving unit 5008 may be disposed inside the internal housing 5009 and connected to the external connector unit 5010 such as a socket structure to receive power from an external power source. In addition, the driving unit 5008 may convert the received power into a current source appropriate for driving the semiconductor light emitting device 5001 of the light emitting module 5003 and supply the converted current source thereto. For example, the driving unit 5008 may be provided as an AC-DC converter, a rectifying circuit part, or the like.

Figure 12:
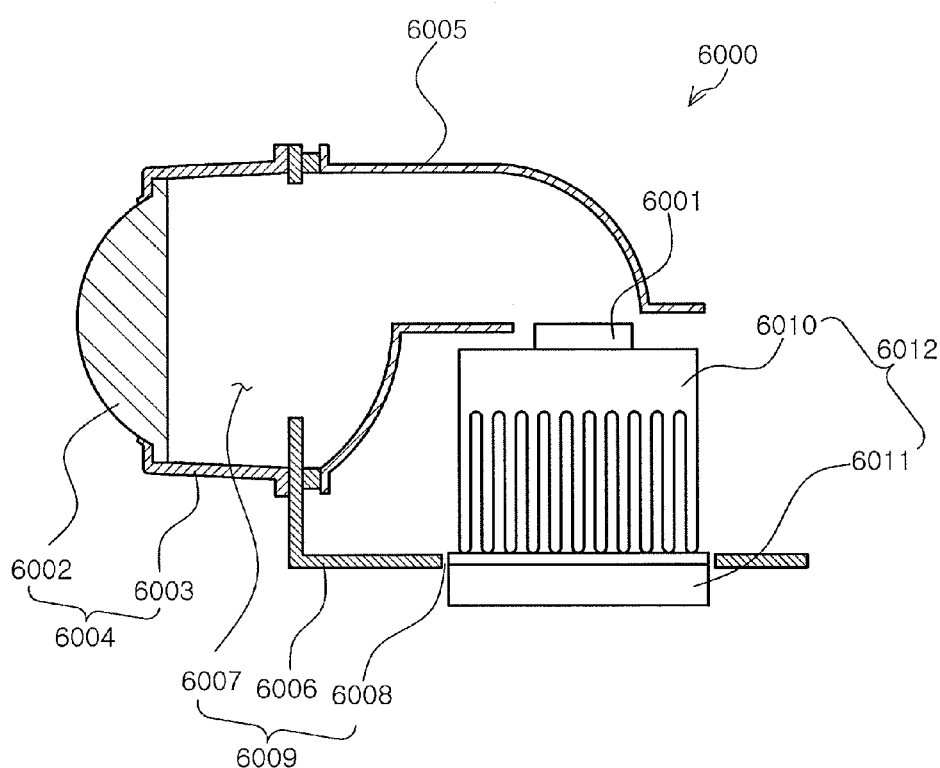
FIG. 12 illustrates a view of an example of a headlamp with a semiconductor light emitting device according to an embodiment.

FIG. 12 is a view illustrating an example of applying the semiconductor light emitting device according to an embodiment to a headlamp. With reference to FIG. 12, a headlamp 6000 used in a vehicle or the like may include a light source 6001, a reflective unit 6005 and a lens cover unit 6004, the lens cover unit 6004 including a hollow guide part 6003 and a lens 6002. In addition, the head lamp 6000 may further include a heat radiating unit 6012 dissipating heat generated by the light source 6001 outwardly. The heat radiating unit 6012 may include a heat sink 6010 and a cooling fan 6011 in order to effectively dissipate heat. In addition, the headlamp 6000 may further include a housing 6009 allowing the heat radiating unit 6012 and the reflective unit 6005 to be fixed thereto and supported thereby. One surface of the housing 6009 may be provided with a central hole 6008 into which the heat radiating unit 6012 is inserted to be coupled thereto. In addition, the other surface of the housing 6009 integrally connected to and bent in a direction perpendicular to one surface of the housing 6009 may be provided with a forward hole 6007 such that the reflective unit 6005 may be disposed above the light source 6001. Accordingly, a forward side may be opened by the reflective unit 6005 and the reflective unit 6005 may be fixed to the housing 1009 such that the opened forward side corresponds to the forward hole 6007, such that light reflected by the reflective unit 6005 disposed above the light source 6001 may pass through the forward hole 6007, and be emitted outwardly.

As set forth above, according to embodiments, a semiconductor light emitting device allowing for simplification of a manufacturing process thereof and having improved current spreading efficiency can be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
  a conductive substrate;
  a light emitting laminate including a second conductivity type semiconductor layer, an active layer, and a first conductivity type semiconductor layer stacked on the conductive substrate;
  a first electrode layer electrically connected to the first conductivity type semiconductor layer;
  a second electrode layer between the conductive substrate and the second conductivity type semiconductor layer, the second electrode layer being electrically connected to the second conductivity type semiconductor layer;
  a passivation layer between the active layer and the second electrode layer, the passivation layer covering at least a lateral surface of the active layer of the light emitting laminate;
  a conductive via extending from the first electrode layer and penetrating through the second conductivity type semiconductor layer and the active layer to be connected to an interior of the first conductivity type semiconductor layer, the passivation layer electrically insulating the conductive via from the active layer; and
  an insulating layer electrically insulating the first electrode layer and the second electrode layer from each other, the first electrode layer being between the conductive substrate and the second electrode layer, and the insulating layer separating the passivation layer from the first electrode layer,
  wherein the passivation layer, the second electrode, and the insulating layer are conformally stacked on each other and trace each other in a region adjacent to the lateral surface of the active layer of the light emitting laminate,
  wherein the second electrode layer includes a protruding region, the protruding region protruding toward the lateral surface of the active layer of the light emitting laminate, and the passivation layer and the insulating layer being conformal on the protruding region of the second electrode layer, and
  wherein an electrode pad is on a partial region of the second electrode layer, the partial region of the second electrode layer being horizontally spaced apart from the protruding region and extending away from the conductive via and from the protruding region of the second electrode layer.

2. The semiconductor light emitting device as claimed in claim 1,
  wherein the electrode pad extends to an exterior of the light emitting laminate.

3. The semiconductor light emitting device as claimed in claim 1, wherein the passivation layer is an etch stop layer having etching characteristics different from those of a semiconductor material in the light emitting laminate.

4. The semiconductor light emitting device as claimed in claim 1, further comprising a second conductivity type ohmic electrode layer between the second conductivity type semiconductor layer and the second electrode layer.

5. The semiconductor light emitting device as claimed in claim 1, further comprising a first conductivity type ohmic electrode layer between the first conductivity type semiconductor layer and the first electrode layer.

6. The semiconductor light emitting device as claimed in claim 1, wherein the first and second conductivity type semiconductor layers are p-type and n-type semiconductor layers, respectively.

7. A semiconductor light emitting device, comprising:
  a conductive substrate;
  a light emitting laminate including a second conductivity type semiconductor layer, an active layer, and a first conductivity type semiconductor layer stacked on the conductive substrate;
  a second electrode layer between the conductive substrate and the second conductivity type semiconductor layer, the second electrode layer being electrically connected to the second conductivity type semiconductor layer;
  a first electrode layer between the conductive substrate and the second electrode layer;
  a conductive via extended from the first electrode layer and passing through the second conductivity type semiconductor layer and the active layer to be connected to an interior of the first conductivity type semiconductor layer;
  an insulating layer electrically insulating the conductive via from the second conductivity type semiconductor layer and the active layer, and electrically insulating the first electrode layer and the second electrode layer from each other;
  an electrode pad on a region of the second electrode layer, the electrode pad extending to an exterior of the light emitting laminate; and
  an etch stop layer between the active layer and the second electrode layer, the etch stop layer covering at least a lateral surface of the active layer of the light emitting laminate and having etching characteristics different from those of a semiconductor material in the light emitting laminate,
  wherein the second electrode layer has a protruding region protruding toward the light emitting laminate, and at least a lateral surface of the active layer of the light emitting laminate being surrounded by the etch stop layer on an upper surface of the protruding region, and
  wherein the protruding region protrudes toward the lateral surface of the active layer of the light emitting laminate, the etch stop layer and the insulating layer being conformal on opposite surfaces of the protruding region of the second electrode layer.

8. The semiconductor light emitting device as claimed in claim 7, wherein the electrode pad is on a partial region of the second electrode layer and extended in a direction oriented away from the conductive via based on the protruding region of the second electrode layer.

9. The semiconductor light emitting device as claimed in claim 7, wherein the etch stop layer directly contacts the conductive via, and is separated from the first electrode layer by the insulating layer.

10. The semiconductor light emitting device as claimed in claim 7, further comprising:
- a first conductivity type ohmic electrode layer disposed between the first conductivity type semiconductor layer and the first electrode layer; and
- a second conductivity type ohmic electrode layer disposed between the second conductivity type semiconductor layer and the second electrode layer.

* * * * *